(12) United States Patent
Windisch et al.

(10) Patent No.: US 10,886,258 B2
(45) Date of Patent: Jan. 5, 2021

(54) LED FILAMENT COMPRISING CONVERSION LAYER

(71) Applicant: OSRAM Opto Semiconductors GmbH, Regensburg (DE)

(72) Inventors: Reiner Windisch, Pettendorf (DE); Florian Bösl, Regensburg (DE); Andreas Dobner, Wenzenbach (DE); Matthias Sperl, Mintraching (DE)

(73) Assignee: OSRAM OLED GmbH, Regensburg (DE)

( * ) Notice: Subject to any disclaimer, the term of this patent is extended or adjusted under 35 U.S.C. 154(b) by 0 days.

(21) Appl. No.: 16/197,939

(22) Filed: Nov. 21, 2018

(65) Prior Publication Data
US 2019/0157250 A1 May 23, 2019

(30) Foreign Application Priority Data
Nov. 23, 2017 (DE) .......................... 10 2017 127 721

(51) Int. Cl.
*H01L 25/07* (2006.01)
*H01L 33/50* (2010.01)
(Continued)

(52) U.S. Cl.
CPC ............ *H01L 25/0753* (2013.01); *F21K 9/90* (2013.01); *F21V 29/87* (2015.01); *H01L 33/504* (2013.01);
(Continued)

(58) Field of Classification Search
CPC ... H01L 25/0753; H01L 33/504; H01L 33/62; H01L 27/153; H01L 27/156
See application file for complete search history.

(56) References Cited

U.S. PATENT DOCUMENTS 8,338,840 B2 * 12/2012 Lerman ............... H01L 25/0753
257/88
8,556,463 B2 * 10/2013 Wang ................... F21V 29/506
362/249.02
(Continued)

FOREIGN PATENT DOCUMENTS

CN        104300073 A        1/2015
CN        205592654 U  *    9/2016
(Continued)

OTHER PUBLICATIONS

German Search Report dated Jul. 13, 2018, of corresponding German Application No. 10 2017 127 721.8.

*Primary Examiner* — Ida M Soward
(74) *Attorney, Agent, or Firm* — DLA Piper LLP (US)

(57) ABSTRACT

An LED filament includes semiconductor chips arranged on a top side of a radiation-transmissive carrier, and at least partly covered with a radiation-transmissive first layer, the first layer and an underside of the carrier are covered with a second layer, phosphor is provided in the second layer, the phosphor is configured to shift a wavelength of the radiation of the semiconductor chip, no phosphor or phosphor including less than 50% of the concentration of the phosphor of the second layer is provided in the first layer, the carrier is formed from a further first layer and a carrier layer having cutouts, the carrier layer is arranged on the further first layer, the semiconductor chips are arranged on the further first layer in the regional of the cutouts of the carrier layer, and the first layer and the further first layer are at least partially covered with the second layer.

20 Claims, 5 Drawing Sheets

(51) Int. Cl.

| | | |
|---|---|---|
| *H01L 33/62* | (2010.01) | |
| *H01L 27/15* | (2006.01) | |
| *H01L 25/075* | (2006.01) | |
| *F21K 9/90* | (2016.01) | |
| *F21V 29/87* | (2015.01) | |
| *F21Y 115/10* | (2016.01) | |

(52) U.S. Cl.
CPC .......... *H01L 33/507* (2013.01); *H01L 33/508* (2013.01); *H01L 33/62* (2013.01); *F21Y 2115/10* (2016.08); *H01L 27/153* (2013.01); *H01L 27/156* (2013.01); *H01L 2933/005* (2013.01); *H01L 2933/0033* (2013.01); *H01L 2933/0041* (2013.01)

(56) References Cited

U.S. PATENT DOCUMENTS

| | | | | |
|---|---|---|---|---|
| 9,103,513 | B2* | 8/2015 | Fan | F21V 23/001 |
| 9,231,171 | B2* | 1/2016 | Liu | H01L 33/504 |
| 9,261,242 | B2* | 2/2016 | Ge | F21V 3/00 |
| 9,287,106 | B1* | 3/2016 | Miao | H01K 3/02 |
| 9,435,492 | B2* | 9/2016 | Heikman | F21V 29/004 |
| 9,732,913 | B2* | 8/2017 | Weekamp | F21K 9/232 |
| 9,905,544 | B2* | 2/2018 | Lee | H01L 33/62 |
| 9,927,114 | B2* | 3/2018 | Dellock | H05B 33/04 |
| 9,941,258 | B2* | 4/2018 | Kong | H01L 25/075 |
| 10,107,456 | B2* | 10/2018 | Dau | F21K 9/232 |
| 10,228,093 | B2* | 3/2019 | Jiang | F21K 9/232 |
| 10,281,088 | B2* | 5/2019 | Chung | F21K 9/232 |
| 10,378,705 | B2* | 8/2019 | Meir | H05K 3/285 |
| 10,598,316 | B2* | 3/2020 | Hofmann | H01L 33/508 |
| 10,600,943 | B2* | 3/2020 | Yao | H01L 33/54 |
| 10,634,287 | B2* | 4/2020 | Steele | F21S 4/20 |
| 2007/0247842 | A1* | 10/2007 | Zampini | F21V 23/04 362/227 |
| 2008/0211386 | A1 | 9/2008 | Choi et al. | |
| 2013/0039050 | A1* | 2/2013 | Dau | G02B 6/0045 362/218 |
| 2013/0058080 | A1 | 3/2013 | Ge et al. | |
| 2014/0131741 | A1* | 5/2014 | Zykin | H01L 25/0753 257/88 |
| 2014/0328058 | A1* | 11/2014 | Steele | F21V 23/02 362/235 |
| 2016/0307879 | A1* | 10/2016 | Lien | H01L 33/56 |
| 2017/0130906 | A1* | 5/2017 | Jiang | H01L 33/62 |
| 2017/0328523 | A1 | 11/2017 | Tanda et al. | |
| 2017/0370539 | A1* | 12/2017 | Xu | F21V 29/89 |
| 2018/0097154 | A1* | 4/2018 | Marfeld | H01L 27/153 |
| 2018/0216787 | A1* | 8/2018 | Chung | H01L 33/641 |
| 2018/0287030 | A1* | 10/2018 | Takeya | H01L 27/153 |
| 2018/0306387 | A1* | 10/2018 | Rieder | F21K 9/90 |
| 2018/0315899 | A1* | 11/2018 | Li | F21K 9/232 |
| 2018/0328543 | A1* | 11/2018 | Bergmann | F21K 9/232 |
| 2019/0017661 | A1* | 1/2019 | Xiong | F21V 25/02 |
| 2019/0139943 | A1* | 5/2019 | Tiwari | H01L 25/0753 |
| 2019/0154206 | A1* | 5/2019 | Jiang | F21K 9/232 |
| 2019/0170304 | A1* | 6/2019 | Jiang | F21K 9/61 |
| 2019/0170305 | A1* | 6/2019 | Xiong | F21V 3/062 |
| 2019/0371979 | A1* | 12/2019 | Imai | H01L 33/504 |

FOREIGN PATENT DOCUMENTS

| | | |
|---|---|---|
| DE | 20 2014 001 943 U1 | 5/2014 |
| DE | 20 2011 110 805 U1 | 7/2016 |

\* cited by examiner

LED FILAMENT COMPRISING CONVERSION LAYER

TECHNICAL FIELD

This disclosure relates to an LED filament comprising a conversion layer, and a method of producing an LED filament comprising a conversion layer.

BACKGROUND

It is known to use LED filaments to generate light in LED retrofit lamps. The LED filaments may comprise a conversion layer used to convert a wavelength of a semiconductor chip into a longer wavelength. There is nonetheless a need to provide an LED filament comprising a conversion layer having improved thermal properties.

SUMMARY

We provide an LED filament including radiation-emitting semiconductor chips, wherein the semiconductor chips are arranged on a top side of a radiation-transmissive carrier, the semiconductor chips and a top side of the carrier are at least partly covered with a radiation-transmissive first layer, the first layer and an underside of the carrier are covered with a second layer, phosphor is provided in the second layer, the phosphor is configured to shift a wavelength of the radiation of the semiconductor chip, no phosphor or phosphor including less than 50% of the concentration of the phosphor of the second layer is provided in the first layer, the carrier is formed from a further first layer and a carrier layer having cutouts, the carrier layer is arranged on the further first layer, the semiconductor chips are arranged on the further first layer in the regional of the cutouts of the carrier layer, and the first layer and the further first layer are at least partially covered with the second layer.

LIST OF REFERENCE SIGNS

Figure 1:
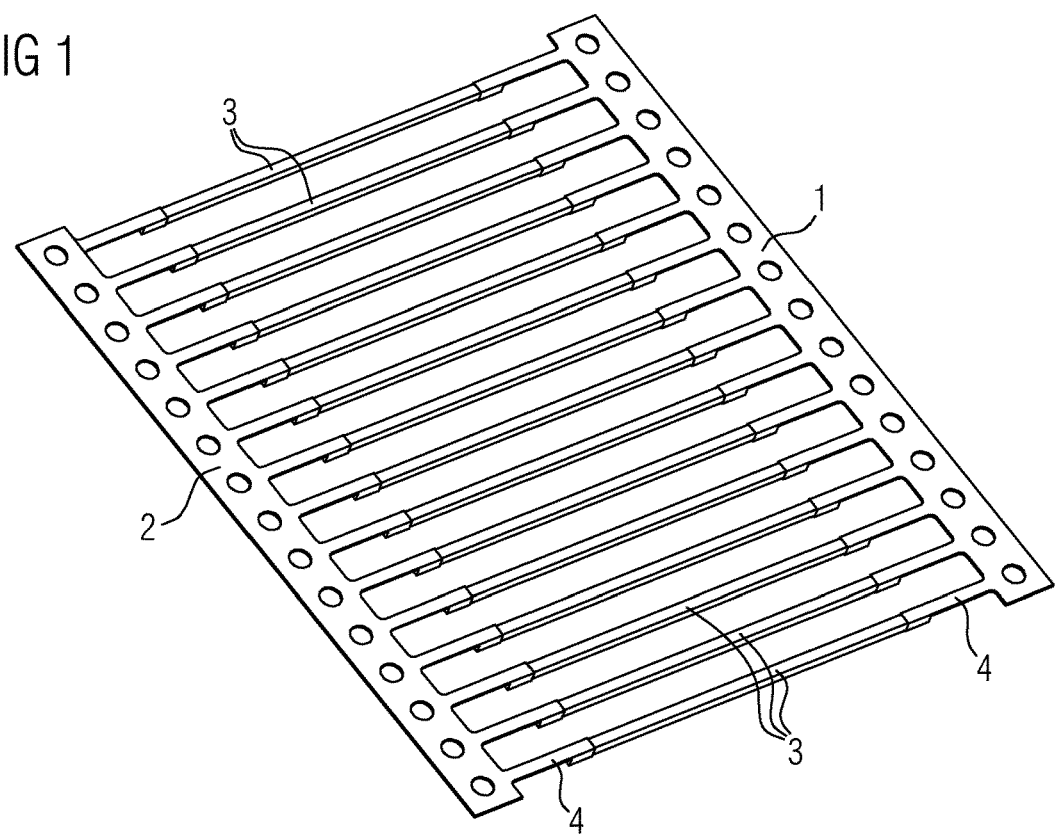
FIG. 1 shows a perspective illustration of filament carriers comprising electrical connections.

1 First metal frame
2 Second metal frame
3 Substrate
4 Segment of metal frame
5 Semiconductor chip
6 First layer
7 Second layer
8 Metal substrate
9 Cutout
10 Row
11 First substrate strips
12 Second substrate strips
13 Thermally conductive particles
14 First connecting layer
15 Second connecting layer
16 Further second layer
17 Inner conversion layer
18 Outer conversion layer
19 Segment of metal substrate
20 LED filament
21 Phosphor
22 Matrix material
23 Further layer (further first layer)

DETAILED DESCRIPTION

One advantage of our LED filament is that the LED filament comprises an improved heat dissipation and/or a reduction of the temperature difference between a filament surface and the light-generating semiconductor chip. This advantage is achieved because the phosphor is arranged in an outer edge region of the LED filament. As a result, the heat generated in the phosphor is generated nearer to the surface of the filament compared to a uniform distribution of the phosphor in the LED filament. Consequently, the conversion heat may be emitted relatively well via the surface of the LED filament. The temperature gradient between the light-emitting semiconductor chip and the surface of the LED filament is reduced as a result. The light-emitting semiconductor chip in this arrangement thus comprises a lower operating temperature.

For this purpose, we provide an LED filament comprising radiation-emitting semiconductor chips, wherein the semiconductor chips are arranged on a top side of a radiation-transmissive carrier, the semiconductor chips and a top side of the carrier are at least partly covered with a radiation-transmissive first layer, the first layer and an underside of the carrier are at least partially covered with a second layer, phosphor is provided in the second layer, the phosphor is configured to shift a wavelength of the radiation of the semiconductor chip, and no phosphor or phosphor comprising less than 50% of the concentration of the phosphor of the second layer is provided in the first layer.

The carrier may be formed from a further first layer and a carrier layer having cutouts. The carrier layer is arranged on the further first layer. The semiconductor chips are arranged on the further first layer in the region of the cutouts of the carrier layer. On the carrier layer, the first layer is arranged. The first layer and the further first layer are at least partially covered with the second layer.

The second layer may constitute an outer layer of the LED filament, wherein in particular an outer side of the second layer is uncovered. A good heat emission is achieved as a result.

The first layer may comprise a matrix material, wherein thermally conductive particles comprising a higher thermal conductivity than the matrix material are provided in the matrix material. As a result, the heat conduction is increased with little impairment of the radiation transmissivity.

The second layer may comprise a thickness of 10 μm to 140 μm. As a result, a sufficiently thick conversion layer is provided, wherein the conversion heat is generated in a second layer comprising a small thickness, thus resulting in a good heat emission toward the outside.

The first layer may comprise a thickness of 300 μm to 1 mm. A stable configuration of the LED filament comprising a sufficient mechanical protection for the semiconductor chips and comprising a good light radiation is provided as a result.

A plurality of semiconductor chips may be arranged on the carrier, wherein the carrier comprises an elongate strip-like shape, the carrier comprises electrical connections at opposite ends, and the semiconductor chips electrically interconnect via electrical lines in series and/or in parallel between the electrical connections.

A second layer may be arranged on the underside of the carrier. As a result, the conversion is carried out uniformly over the entire surface of the LED filament. The same electromagnetic spectrum is thus radiated over 360°.

A plurality of semiconductor chips may be arranged on the carrier, wherein the carrier comprises an elongate strip-like shape, the carrier comprises electrical connections at opposite ends, the semiconductor chips electrically interconnect in series and/or in parallel between the electrical connections via electrical lines, and the component is formed as an LED filament.

The second layer and the first layer may comprise an identical matrix material, in particular silicone. A simple construction of the LED filament is thus provided. The layers may be applied by different methods.

The carrier may be constituted from a further first layer and a leadframe comprising cutouts, wherein the leadframe is arranged on the further first layer, the semiconductor chips are arranged in the cutouts and on the further first layer, the first layer is arranged on the leadframe, and the first layer and the further first layer are covered with the second layer.

The LED filament is produced simply and rapidly by the following method: semiconductor chips are arranged on a top side of a radiation-transmissive carrier, wherein the semiconductor chips and a top side of the carrier are at least partly covered with a radiation-transmissive first layer, the first layer and an underside of the carrier are covered with a second layer, and phosphor is provided in the second layer, wherein the phosphor is configured to shift a wavelength of the radiation of the semiconductor chip, and no phosphor or phosphor comprising less than 50% of the concentration of the phosphor of the second layer is provided in the first layer.

A leadframe comprising at least one cutout may be applied on a top side of a further first layer, wherein the further first layer and the leadframe constitute the carrier, the semiconductor chips are placed in the cutouts of the leadframe onto the top side of the further first layer, the first layer is applied on the semiconductor chips and on the leadframe, and a further second layer is applied on the further first layer.

The first layer and the further first layer may be produced from a mold material by a mold method. A simple and precise shaping for the carrier may be achieved as a result.

The second layer and/or the further second layer may be applied by spraying. The second layer may thus be applied rapidly and with sufficient thickness.

A plurality of rows of cutouts may be provided next to one another on a carrier layer, wherein a further first layer is formed for each row. Semiconductor chips may be arranged in the cutouts of the rows. A first layer may be applied on each row of the semiconductor chips. A second layer may be applied on the first layers of the rows. A further second layer may be applied on the further first layers of the rows. Afterward, the individual rows comprising the semiconductor chips may be singulated and individual LED filaments are obtained.

The first layer and/or the further first layer is/are formed as strips. The strips of the first layer may be applied in one piece. Moreover, the strips of the further first layer may be applied in one piece, as well.

The first layer may be formed as a strip, wherein the strip extends in a longitudinal direction of the LED filament, a connecting layer is formed on each of the opposite longitudinal sides of the strip, the connecting layers are in one piece with the strip, and the connecting layers have a smaller thickness than the strip in a direction perpendicular to the level of the carrier layer.

The connecting layers may be laterally guided up to an outer lateral border area of the filament.

The further layer may be formed as a strip, wherein the strip extends in a longitudinal direction of the LED filament, a connecting layer is formed on each of the opposite longitudinal sides of the strip, the connecting layers are in one piece with the strip, and the connecting layers have a smaller thickness than the strip in a direction perpendicular to the level of the carrier layer.

The connecting layers may be laterally guided up to an outer lateral border area of the filament.

The carrier layer may be formed from plastic or from a semiconductor material.

The carrier layer may be formed from a metal substrate. The metal substrate may be a metal sheet or a metal plate. The carrier layer may be formed as a leadframe.

The above-described properties, features and advantages and the way in which they are achieved will become clearer and more clearly understood in association with the following description of examples that are explained in greater detail in association with the drawings.

Figure 2:
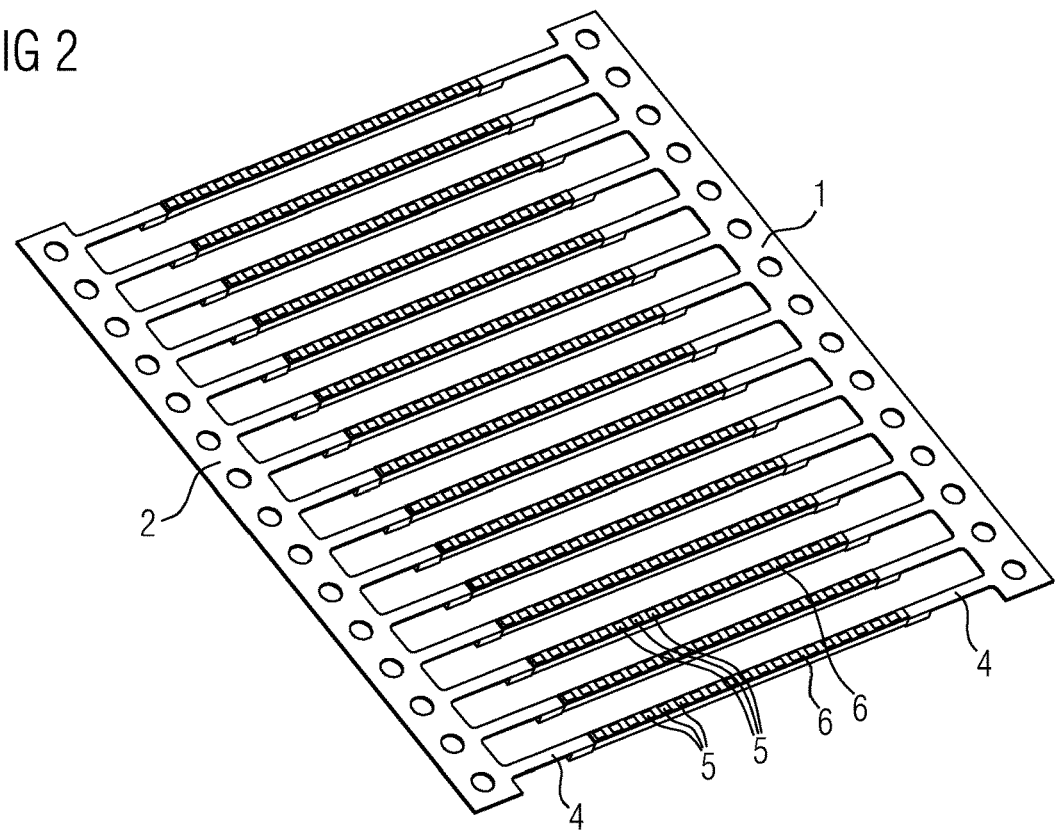
FIG. 2 shows the filament carriers after placing the light-emitting semiconductor chips.
Figure 3:
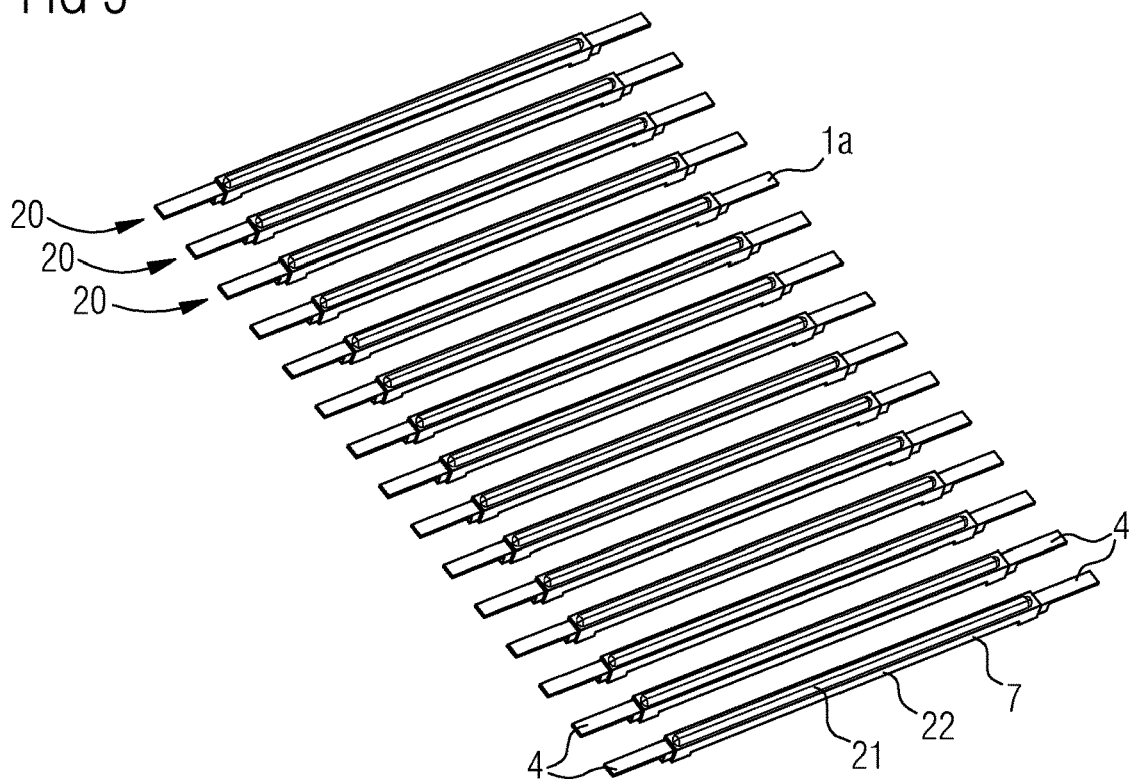
FIG. 3 shows the filament carriers after applying a first layer and a second layer comprising phosphor.

FIGS. 1 to 3 show method steps of producing an LED filament. FIG. 1 shows, in a perspective illustration, two metal frames 1, 2 connected to opposite ends of strip-shaped carriers 3. The metal frames 1, 2 may be fabricated from a nickel-plated high-grade steel, for example. Each carrier 3 connects by the two ends to a respective strip-shaped segment 4 of the respective metal frame 1, 2. The carriers 3 may be constituted from glass, ceramic or sapphire, for example. The segments 4 of the metal frames 1, 2 may connect to the ends of the substrates 3 by adhesive bonding or clamping, for example.

FIG. 2 shows the arrangement from FIG. 1 after applying light-emitting semiconductor chips 5 on the carriers 3 and applying a first layer 6 on the carriers 3 and on the semiconductor chips 5. The first layer 6 is constituted from a light-transmissive material. By way of example, the first layer 6 may be constituted from silicone. The first layer 6 thus covers the top side of the carrier 3 and the semiconductor chips 5 over the entire length of the carrier 3. Moreover, before applying the first layer 6, the semiconductor chips 5, via electrical lines, were interconnected in series and/or in parallel with one another and electrically conductively connected to the opposite segments 4 of a carrier 3. The first layer 6 may additionally comprise thermally conductive particles that increase the thermal conductivity of the first layer 6. By way of example, glass or cristobalite may be used as thermally conductive particles. The first layer 6 contains none or substantially no phosphor. The first layer 6 may be constituted from a mold material and applied on the carrier and the semiconductor chips with the aid of a mold method.

Afterward, a second layer 7 is applied on the outer side of the substrate 3 and the outer side of the first layer 6, as illustrated in FIG. 3. The second layer 7 comprises phosphor 21 and constitutes a conversion layer. The second layer 7 may comprise a matrix material 22, e.g., silicone, into which phosphor 21 is mixed. The individual filaments 20 comprising the segments 4 have been released from the metal frame 1, 2. By way of example, the segments 4 may be separated from the metal frames 1, 2 by a stamping method.

Figure 4:
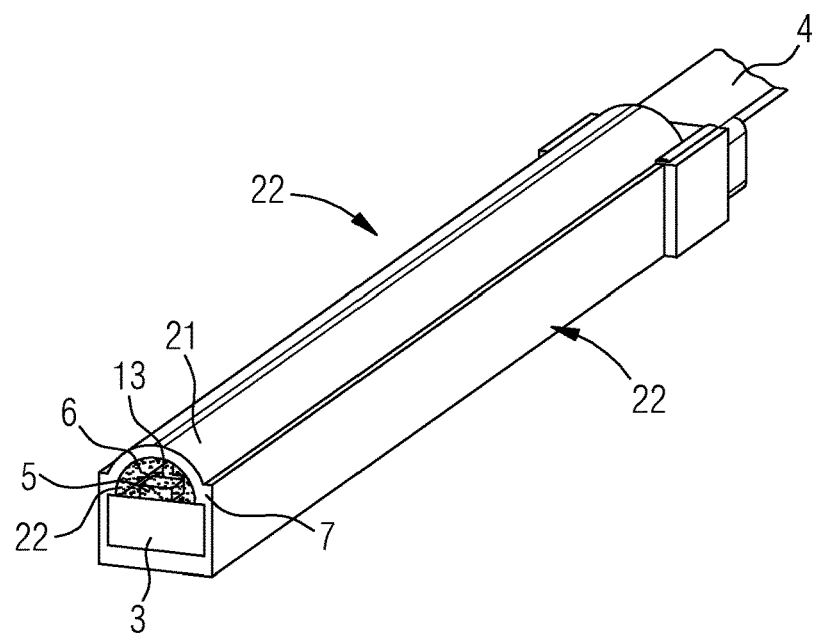
FIG. 4 shows a cross section through an LED filament from FIG. 3.

FIG. 4 shows a cross section through an LED filament 20 from FIG. 3. The semiconductor chips 5 are arranged on the top side of the carrier 3. Moreover, the semiconductor chips 5 are covered by the first layer 6. Thermally conductive particles 13 may be provided in the first layer 6. The carrier 3 and the first layer 6 are covered with the second layer 7 over the whole area. The first layer 6 may comprise a thickness of 200 µm to 1 mm perpendicular to the top side of the substrate 3. The carrier 3 may comprise a thickness of 200 µm to 1 mm perpendicular to the top side of the carrier 3. The second layer 7 comprising phosphor 21 and constitutes a conversion layer, is configured to shift the wavelength of the electromagnetic radiation emitted by the semiconductor chip 5. The second layer 7 may comprise a thickness of 20 µm to 120 µm. The thermally conductive particles 13 may be arranged with a concentration by weight of, for example, 30% to 50% in the first layer 6. In this way, it is possible to improve the thermal conductivity of the first layer 6 with the use of silicone as material for the first layer 6 from approximately 0.2 watt per (meter×kelvin) to 0.5 watt per (meter×kelvin).

FIGS. 5 to 10 show method steps of a second production method of producing an LED filament comprising a second layer 7 comprising phosphor.

Figure 5:
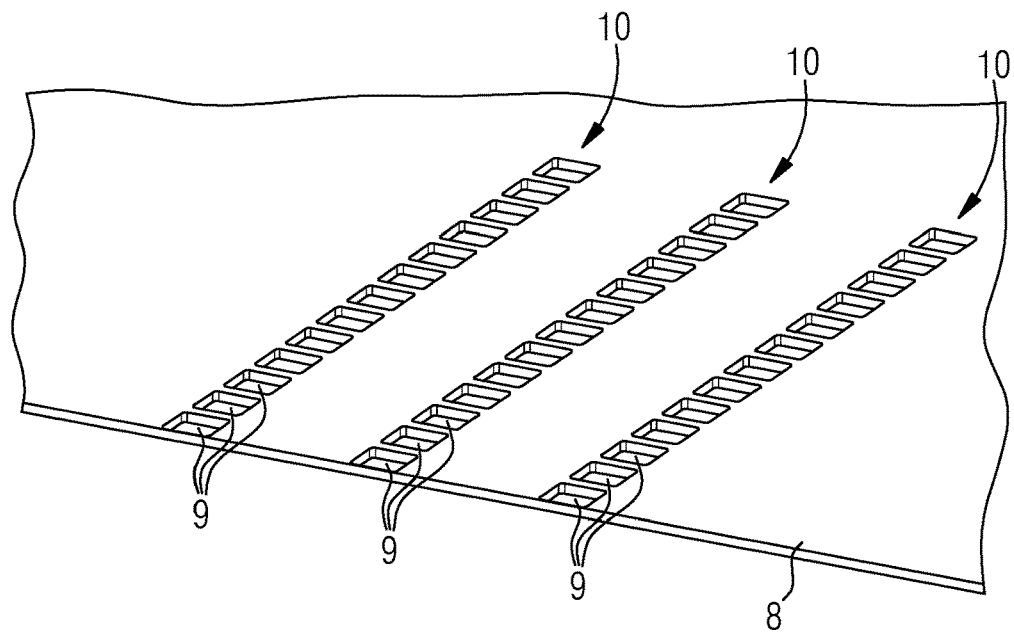
FIG. 5 shows a metal substrate for filaments comprising a leadframe.
Figure 6:
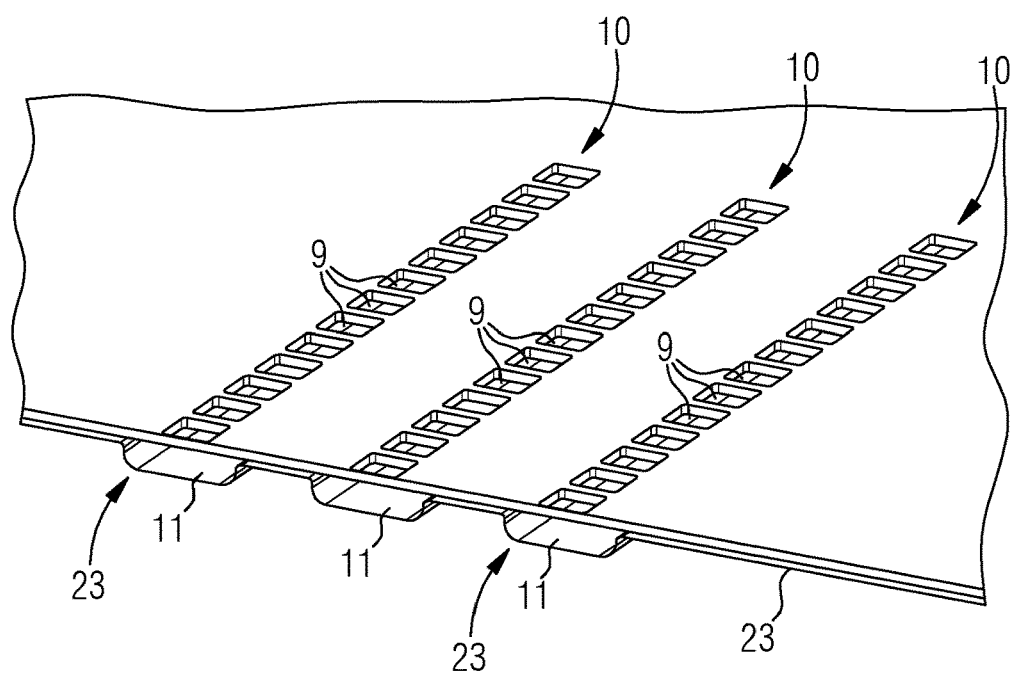
FIG. 6 shows the metal substrate comprising molded strips.

FIG. 5 shows a perspective partial cross section through a metal substrate 8 formed, for example, as a thin metal film. The metal substrate 8 constitutes a carrier layer comprising a higher mechanical stability than a mold material. The carrier layer may also consist of materials other than metal such as, e.g., plastic, semiconductor materials, etc. The carrier layer may be formed such that it is electrically conducting or electrically insulating. The thickness of the metal substrate 8 may be 10 to 100 µm. Moreover, the metal substrate may also be formed as a metal plate comprising a larger thickness of, e.g., up to 300 µm. The metal substrate 8 is formed mirror-symmetrically with respect to the sectional edge. Three rows 10 of cutouts 9 are introduced in the metal substrate 8. On account of the sectional illustration, only the halves of each of the rows 10 are illustrated.

In a subsequent method step, for example, by a mold process, in particular an injection molding method, there is applied on an underside of the metal substrate 8 a further layer 23 in the form of three substrate strips 11 respectively along the rows 10 of the cutouts 9. The substrate strips 11 comprise a length larger than the rows of the cutouts, that is to say that the substrate strips 11 project beyond the ends of the rows 10. The substrate strips 11 comprise a width somewhat wider than the cutouts 9. The further layer 23 comprising the three substrate strips 11 is produced from a light-transmissive material, in particular a transparent mold material. By way of example, the mold material may comprise epoxy resin, silicone and/or a mixture thereof. Moreover, the substrate strip 11 may contain thermally conductive particles, for example, comprising cristobalite or glass. The further layer 23 may consist of the same material as the first layer or the first layer may consist of the same material as the further layer 23.

The cutouts 9 may be partly or completely filled with the mold material. Depending on the production method used, the substrate strips 11 may connect via a connecting layer 14. The connecting layer 14 comprises a smaller thickness perpendicular to the plane of the metal substrate 8 than the substrate strips 11. The connecting layers 14 and the substrate strips 11 constitute the further layer 23.

Figure 7:
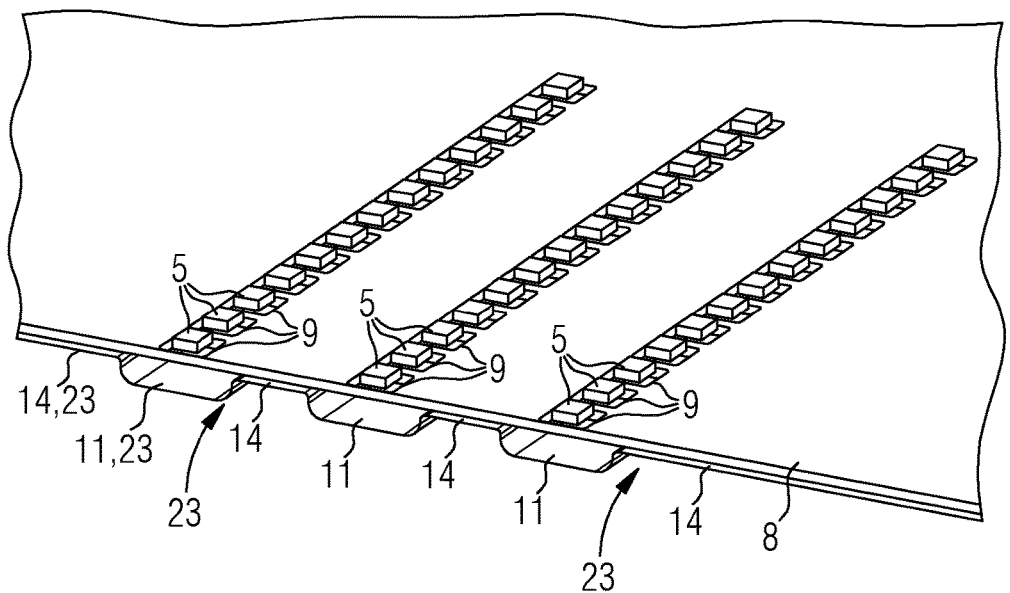
FIG. 7 shows the metal substrate comprising mounted semiconductor chips.

In a subsequent method step illustrated in FIG. 7, radiation-emitting semiconductor chips 5, for example, light-emitting diodes are placed in the region of the cutouts 9 onto the substrate strips 11 and secured thereon. By way of example, the semiconductor chips 5 may be adhesively bonded onto the substrate strips 11. Afterward, the semiconductor chips 5 are electrically contacted and electrically interconnected in a desired manner, which is not explicitly illustrated. By way of example, the semiconductor chips 5 of a row may electrically connect in series.

Figure 8:
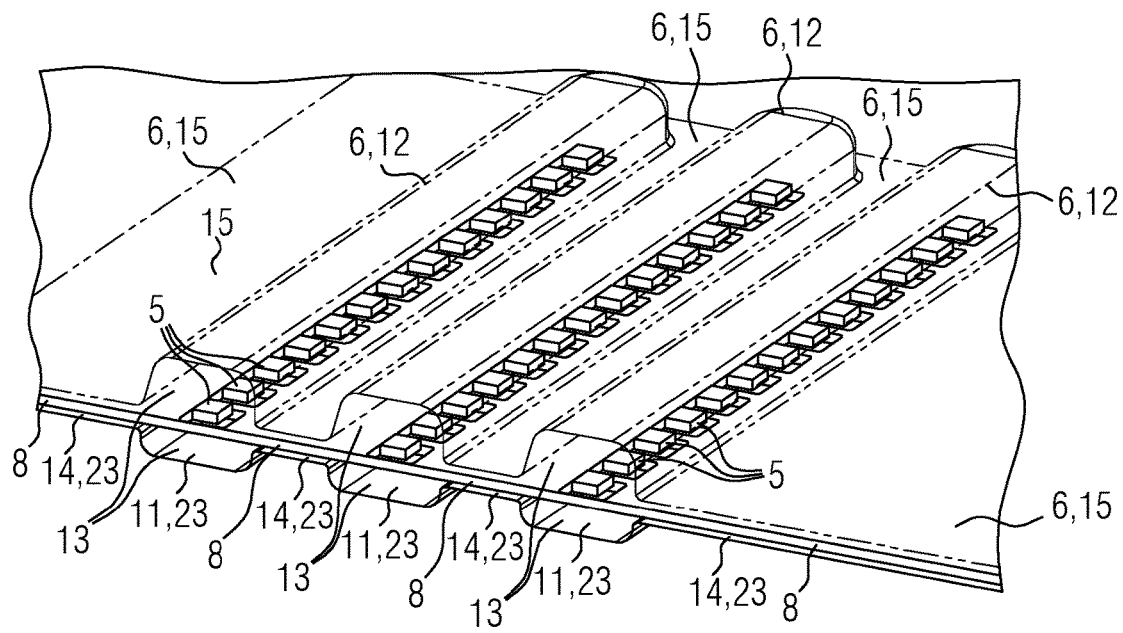
FIG. 8 shows the metal substrate comprising mounted semiconductor chips, wherein the semiconductor chips are covered with molded strips.

A subsequent method step illustrated in FIG. 8, involves introducing by filling a first layer 6 comprising second substrate strips 12 along the rows 10 of the cutouts 9 above the semiconductor chips 5. The second substrate strips 12 may connect to one another via a second connecting layer 15. The second connecting layers 15 and the second substrate strips 12 constitute the first layer 6. The second connecting layer 15 comprises a smaller thickness perpendicular to the plane of the metal substrate 8 than the second substrate strips 12. The second substrate strips 12 are formed parallel to the rows of the cutouts 9. Moreover, the second substrate strips 12 comprise a width somewhat wider than the width of the cutouts 9. Moreover, the second substrate strips 12 extend beyond the ends of the rows of the cutouts 9. The second substrate strips 12 preferably comprise the same width and length as the first substrate strips 11 and are arranged mirror-symmetrically with respect to the first substrate strips on the metal substrate 8. FIG. 8 illustrates only a half of the second substrate strips 12. Depending on the production method used, it is also possible to dispense with the second connecting layers 15 between the second substrate strips 12.

The second substrate strips 12 may likewise be produced from a transparent mold material by a mold process. Furthermore, the second substrate strips 12 may also contain thermally conductive particles 13. Both the substrate strips 11 on the underside and the second substrate strips 12 on the top side may be configured in the form of a continuous surface, wherein the connecting layers 14, 15 comprise a thickness thinner than the respective substrate strips 11, 12 at least by 50%, in particular at least by 75%. Thermally conductive particles 13 may be provided in the first and/or in the second substrate strips 11, 12.

Figure 9:
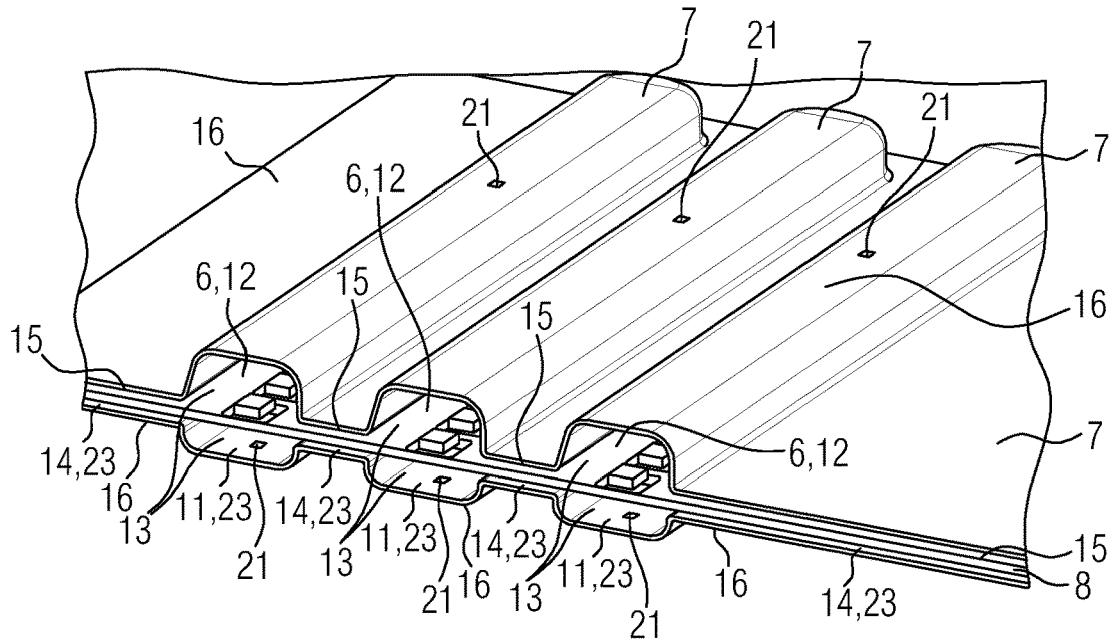
FIG. 9 shows the arrangement from FIG. 8 comprising conversion layers applied on both sides.

Afterward, a second layer 7 comprising phosphor is applied on the first layer 6 comprising the second substrate strips 12 and the second connecting layer 15. Moreover, a further second layer 16 comprising phosphor is applied on the first substrate strips 11 and the first connecting layer 14 as illustrated in FIG. 9. The second layer 7 and the further second layer 15 constitute conversion layers. The conversion layers 7, 15 may be applied on the arrangement as exterior layers with the aid of a spraying process, for example. Afterward, individual filaments are separated from the arrangement by sawing, for example.

In all the examples in FIGS. 3 to 9, the thickness of the second layer 7 and of the further second layer 16 comprising the phosphor may be 20 µm, 30 µm, 40 µm or up to 80 µm, 100 µm or 120 µm.

With the aid of the described examples of the LED filament arrangements, it is possible to achieve a reduction of the temperature between the surface of the LED filament and the semiconductor chip in the region of the semiconductor chip in the LED filament by up to 10% or more. Moreover, the temperature difference between the surface of the LED filament and the semiconductor chip on account of the exterior conversion layer 7, 16, may halve, for example, decrease from approximately 6° C. to approximately 3° C. The semiconductor chips may be configured, for example, in the form of light-emitting LEDs, for example, as indium gallium nitride LEDs. Other semiconductor materials may also be used to form the light-emitting semiconductor chips. Garnets and/or nitridic red phosphors may be used as phosphor for the second layer 7 and the further second layer 16. By way of example, orthosilicates or nitrido-orthosilicates may be used as phosphors. As matrix material for the conversion layers 7, 16, silicone may be used, into which the phosphors are mixed.

On account of the production methods described, a transition between the first layer and the second layer and/or the further second layer may be in the range of an order of magnitude of the size of the phosphors. Different phosphors may be arranged in the second and/or further second layer 7, 16.

Figure 10:
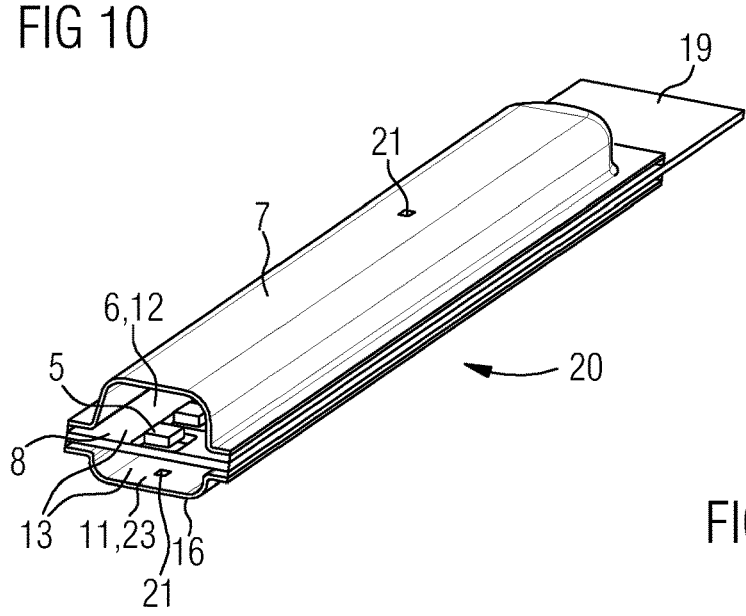
FIG. 10 shows a cross section through an LED filament singulated from the arrangement from FIG. 9.

FIG. 10 shows half an LED filament 20 separated from the arrangement from FIG. 9. In this example, a segment 19 of the metal substrate 8 may serve as electrical connection for the semiconductor chips. The LED filament 20 is formed mirror-symmetrically with respect to the sectional plane with the exception of an electrical isolation (not shown in the figures) of the second electrical connection from the rest of the metal substrate. The metal substrate 8 and the first substrate strip 11 constitute a carrier. As explained above, instead of the metal substrate, some other material may also be used to constitute a carrier layer.

Figure 11:
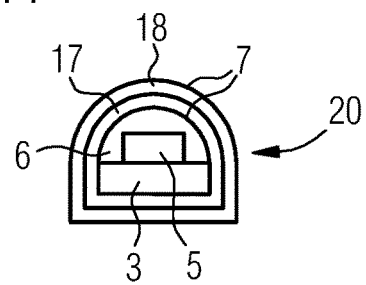
FIG. 11 shows a cross section through an LED filament comprising a second layer comprising an inner and an outer conversion layer.

FIG. 11 shows a schematic cross section through an LED filament 20 in accordance with FIG. 4, wherein, in this example, the second layer 7 comprises an inner conversion layer 17 and an outer conversion layer 18. Each second or further second layer 7, 16 may comprise an inner conversion layer and an outer conversion layer. By way of example, predominantly red phosphor may be provided in the inner conversion layer 17 and predominantly green phosphor may be provided in the outer conversion layer 18. A green phosphor is understood to mean a phosphor that absorbs electromagnetic radiation and emits substantially light comprising a green color. A red phosphor means a phosphor that absorbs electromagnetic radiation and emits substantially light comprising a red color.

In all configurations of the LED filaments, no phosphor or phosphor comprising less than 50% of the concentration of the phosphor of the second layer 7 and/or of the further second layer 16 may be present in the first layer.

Our LED filaments have been illustrated and described in greater detail on the basis of preferred examples. Nevertheless, this disclosure is not restricted to the examples disclosed. Rather, other variations may be derived therefrom by those skilled in the art, without departing from the scope of protection of the appended claims.

The invention claimed is:

1. An LED filament comprising radiation-emitting semiconductor chips, wherein the semiconductor chips are arranged on a top side of a radiation-transmissive carrier, the semiconductor chips and a top side of the carrier are at least partly covered with a radiation-transmissive first layer, the first layer and an underside of the carrier are covered with a second layer, phosphor is provided in the second layer, the phosphor is configured to shift a wavelength of the radiation of the semiconductor chip, no phosphor or phosphor comprising less than 50% of the concentration of the phosphor of the second layer is provided in the first layer, the carrier comprises a further first layer and a carrier layer, the carrier layer is arranged with a bottom side on the further first layer, the carrier layer has a top side opposite the bottom side, the carrier layer has cutouts extending from the top side to the bottom side of the carrier layer, wherein the further first layer is at the cutouts uncovered by the carrier layer, the semiconductor chips are arranged within the cutouts of the carrier layer and on the further first layer, and the first layer and the further first layer are at least partially covered with the second layer.

2. The LED filament according to claim 1, wherein the second layer constitutes an outer layer of the LED filament.

3. The LED filament according to claim 1, wherein the first layer comprises a matrix material, and thermally conductive particles comprising a higher thermal conductivity than the matrix material are provided in the matrix material.

4. The LED filament according to claim 1, wherein the second layer comprises a thickness of 10 µm to 140 µm.

5. The LED filament according to claim 1, wherein the first layer comprises a thickness of 300 µm to 1 mm.

6. The LED filament according to claim 1, wherein semiconductor chips are arranged on the carrier in the region of the cutouts of the carrier layer, the carrier comprises an elongate strip shape, the carrier comprises electrical connections at opposite ends, and the semiconductor chips electrically interconnect in series and/or in parallel between the electrical connections.

7. The LED filament according to claim 1, wherein the second layer and the first layer comprise identical matrix material.

8. The LED filament according to claim 1, wherein the second layer comprises an inner and an outer conversion layer, and predominantly or only red phosphor is present in the inner conversion layer and predominantly or only green phosphor is present in the outer conversion layer.

9. The LED filament according to claim 1, wherein the first layer is formed as a strip, the strip extends in a longitudinal direction of the LED filament, a connecting layer is formed on each of the opposite longitudinal sides of the strip, the connecting layers are in one piece with the strip, and the connecting layers have a smaller thickness than the strip in a direction perpendicular to the level of the carrier layer.

10. The LED filament according to claim 9, wherein the connecting layers are laterally guided up to an outer lateral border area of the filament.

11. The LED filament according claim 1, wherein a further layer is formed as a strip, the strip extends in a longitudinal direction of the LED filament, a connecting layer is formed on each of the opposite longitudinal sides of the strip, the connecting layers are in one piece with the strip, and the connecting layers have a smaller thickness than the strip in a direction perpendicular to the level of the carrier layer.

12. The LED filament according to claim 11, wherein the connecting layers are laterally guided up to an outer lateral border area of the filament.

13. The LED filament according to claim 1, wherein the carrier layer is formed from plastic or from a semiconductor material.

14. The LED filament according to claim 1, wherein the carrier layer is formed from a metal substrate.

15. The LED filament according to claim 1, wherein the carrier layer is formed as a leadframe.

16. A method of producing the LED filament according to claim 1, comprising:
- arranging the semiconductor chips on a top side of a radiation-transmissive carrier, wherein the semiconductor chips and a top side of the carrier are at least partly covered with a radiation-transmissive first layer, and the first layer and an underside of the carrier are at least partially covered with a second layer,
- providing phosphor in the second layer, wherein the phosphor is configured to shift a wavelength of the radiation of the semiconductor chip, and no phosphor or phosphor comprising less than 50% of the concentration of the phosphor of the second layer is provided in the first layer,
- applying a carrier layer with a bottom side on a top side of a further first layer, wherein the carrier layer has a top side opposite the bottom side, the carrier layer has cutouts extending from the top side to the bottom side of the carrier layer, the further first layer is uncovered by the carrier layer at the cutouts, and the further first layer and the carrier layer constitute the carrier, and
- arranging the semiconductor chips onto the top side of the further first layer within the cutouts of the carrier layer, wherein the first layer is applied on the semiconductor chips and on the carrier layer, a second layer is at least partially applied on the first layer, and a further second layer is at least partially applied on the further first layer.

17. The method according to claim 16, wherein the first layer and the further first layer are produced from a mold material by a mold method.

18. The method according to claim 16, wherein the second layer and the further second layer are applied by spraying.

19. The method according to claim 16, wherein a plurality of rows of cutouts are provided next to one another in the carrier layer, a strip of the further first layer is formed alongside of each row of cutouts, semiconductor chips are arranged in the region of the cutouts, a strip of the first layer is applied on each row of the semiconductor chips, the second layer is applied on the strip of the first layers, a further second layer is applied on the strips of the further first layer, afterward, the individual rows comprising the semiconductor chips are singulated, and the singulated rows of semiconductor chips constitute LED filaments.

20. The method according to claim 19, wherein the strips of the first layer are applied in one piece, and the strips of the further first layer are applied in one piece.

* * * * *